US012720774B2

(12) United States Patent
Liu et al.

(10) Patent No.: US 12,720,774 B2
(45) Date of Patent: Aug. 25, 2026

(54) DEVICE HAVING AN IN-SUBSTRATE INDUCTOR AND METHOD FOR MAKING THE INDUCTOR

(71) Applicant: QUALCOMM Incorporated, San Diego, CA (US)

(72) Inventors: Kai Liu, Phoenix, AZ (US); Jui-Yi Chiu, Taichung City (TW); Jonghae Kim, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 832 days.

(21) Appl. No.: 18/067,557

(22) Filed: Dec. 16, 2022

(65) Prior Publication Data

US 2024/0204039 A1 Jun. 20, 2024

(51) Int. Cl.

| | |
|---|---|
| ***H10D 1/20*** | (2025.01) |
| ***H05K 1/11*** | (2006.01) |
| ***H05K 1/16*** | (2006.01) |
| ***H10W 20/40*** | (2026.01) |
| ***H10W 20/41*** | (2026.01) |
| ***H10W 20/42*** | (2026.01) |

(52) U.S. Cl.

CPC ............... *H10D 1/20* (2025.01); *H05K 1/115* (2013.01); *H05K 1/165* (2013.01); *H10W 20/42* (2026.01); *H10W 20/435* (2026.01); *H10W 20/497* (2026.01); *H05K 2201/0215* (2013.01)

(58) Field of Classification Search

CPC ...... H10D 1/20; H10W 20/497; H10W 20/42; H10W 20/435; H05K 1/115; H05K 1/165; H05K 2201/0215

See application file for complete search history.

(56) References Cited

U.S. PATENT DOCUMENTS

| | | | | |
|---|---|---|---|---|
| 2014/0159851 A1* | 6/2014 | Mano | H01F 17/0013 336/200 |
| 2019/0348356 A1* | 11/2019 | Hsieh | H10D 1/20 |
| 2021/0329783 A1 | 10/2021 | Kawai et al. | |

FOREIGN PATENT DOCUMENTS

| | | |
|---|---|---|
| JP | 2016054186 A | 4/2016 |

OTHER PUBLICATIONS

International Search Report and Written Opinion—PCT/US2023/082130—ISA/EPO—Apr. 5, 2024.

* cited by examiner

*Primary Examiner* — Brigitte A Paterson

(74) *Attorney, Agent, or Firm* — Muncy, Geissler, Olds & Lowe, P.C.

(57) ABSTRACT

Disclosed is a device including an inductor that includes a substrate; a plurality of vias disposed through the substrate and filled with a conductive metal; a via structure disposed through the substrate and extending between the plurality of vias, wherein the via structure is filled with a magnetic material to form a magnetic core of the inductor; and one or more patterned metallization layers interconnecting the conductive metal of the plurality of vias; wherein the one or more patterned metallization layers and the conductive metal filling the plurality of vias form a winding of the inductor about the magnetic core.

16 Claims, 12 Drawing Sheets

530
528
530
526
504
524
508
514
506
512
500
516
520
502
522

532
532
528
526
504
524
508
514
506
512
500
516
520
502
522

DEVICE HAVING AN IN-SUBSTRATE INDUCTOR AND METHOD FOR MAKING THE INDUCTOR

FIELD OF DISCLOSURE

The present disclosure relates generally to semiconductor devices including electronic devices incorporating the semiconductor devices, and more specifically, but not exclusively, to inductor devices and fabrication techniques thereof.

BACKGROUND

Integrated circuit technology has achieved great strides in advancing computing power through miniaturization of active components. The various packaging technologies such can be found in many electronic devices, including processors, servers, radio frequency (RF) integrated circuits, etc. Advanced packaging and processing techniques allow for complex devices, such as multi-die devices and system on a chip (SOC) devices, which, may include multiple function blocks, with each function block designed to perform a specific function, such as, for example, a microprocessor function, a graphics processing unit (GPU) function, a communications function (e.g., Wi-Fi, Bluetooth, and other communications), and the like.

Power delivery networks used to provide power to electronic circuits often include such integrated circuit technology. Voltage regulators or converters may be inserted along the power path of the power delivery network to provide the necessary voltages for various portions of the circuit. An integrated voltage regulator (IVR) is one such integrated circuit device that may be incorporated into a power delivery network. The IVR may be implemented as a switching voltage regulator incorporating both active (e.g., switching transistors) and passive components (e.g., inductors). IVRs may be designed to have a high output inductance and low direct-current (DC) resistance.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In accordance with various aspects disclosed herein, at least one aspect includes a device including an inductor includes a substrate; a plurality of vias disposed through the substrate and filled with a conductive metal; a via structure disposed through the substrate and extending between the plurality of vias, wherein the via structure is filled with a magnetic material to form a magnetic core of the inductor; and one or more patterned metallization layers interconnecting the conductive metal of the plurality of vias; wherein the one or more patterned metallization layers and the conductive metal filling the plurality of vias form a winding of the inductor about the magnetic core.

In accordance with various aspects disclosed herein, at least one aspect includes a device including an inductor includes a substrate having a first planar surface and a second planar surface opposite the first planar surface; a first row of vias disposed through the substrate and filled with a conductive metal; a second row of vias disposed through the substrate and filled with the conductive metal, wherein the second row of vias is laterally displaced from the first row of vias; a via structure disposed through the substrate and extending generally parallel to both the first row of vias and the second row of vias, the via structure being filled with a magnetic material to form a magnetic core of the inductor that is electrically insulated from the conductive metal filling the first row of vias and the conductive metal filling the second row of vias; a first patterned metallization layer exterior to the first planar surface and interconnecting the conductive metal of each via of the first row of vias with the conductive metal of a corresponding via of the second row of vias; and a second patterned metallization layer exterior to the second planar surface and interconnecting the conductive metal of each via of the first row of vias with the conductive metal of a corresponding via of the second row of vias; wherein the first patterned metallization layer, the second patterned metallization layer, the conductive metal filling the first row of vias, and conductive metal filling the second row of vias form a winding of the inductor about the magnetic core.

In accordance with various aspects disclosed herein, at least one aspect includes a method of fabricating an inductor includes forming a plurality of vias disposed through a substrate and filled with a conductive metal; forming a via structure disposed through the substrate and filled with a magnetic material, the via structure extending between the plurality of vias and forming a magnetic core of the inductor; and forming one or more patterned metallization layers interconnecting the conductive metal of the plurality of vias; wherein the one or more patterned metallization layers, the conductive metal filling the plurality of vias form a winding of the inductor about the magnetic core.

In accordance with various aspects disclosed herein, at least one aspect includes a method of fabricating an inductor includes forming a first row of vias through a substrate; forming a second row of vias through the substrate, wherein the second row of vias is laterally displaced from the first row of vias; forming a via structure through the substrate extending generally parallel to both the first row of vias and the second row of vias; filling the first row of vias and the second row of vias with a conductive metal; filling the via structure with a magnetic material; forming a first patterned metallization layer exterior to a first planar surface of the substrate to electrically interconnect the conductive metal of each via of the first row of vias with the conductive metal of a corresponding via of the second row of vias; and forming a second patterned metallization layer exterior to a second planar surface of the substrate opposite the first planar surface to electrically interconnect the conductive metal of each via of the first row of vias with the conductive metal of a corresponding via of the second row of vias; wherein the first patterned metallization layer, the second patterned metallization layer, the conductive metal filling the first row of vias, and conductive metal filling the second row of vias form a winding of the inductor about a magnetic core formed by the magnetic material in the via structure.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
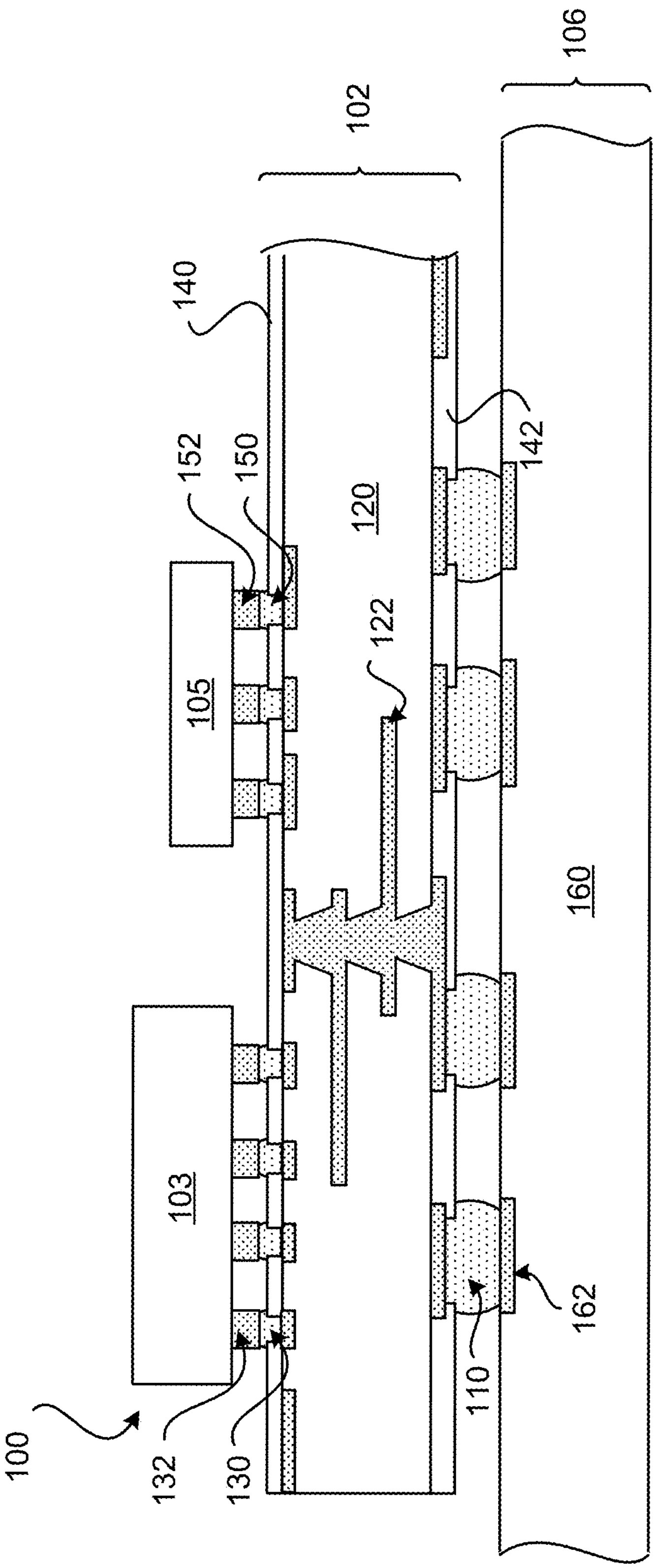
FIG. 1 illustrates a profile view of a package that includes a surface mount substrate, an integrated device and an integrated passive device, according to aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting As used herein, the singular forms “a,” “an,” and “the” are intended to include the plural forms as well, unless the context clearly indicates otherwise. It will be further understood that the terms “comprises.” “comprising.” “includes,” and/or “including.” when used herein, specify the presence of stated features, integers, steps, operations, elements, and/or components, but do not preclude the presence or addition of one or more other features, integers, steps, operations, elements, components, and/or groups thereof.

FIG. 1 illustrates a profile view of a package 100 that includes a surface mount substrate 102, an integrated device 103 (e.g., integrated voltage regulator), and an integrated passive device 105 (IPD) (e.g., inductor), according to aspects of the disclosure. The package 100 may be coupled to a printed circuit board (PCB) 106 through a plurality of solder interconnects 110. The PCB 106 may include at least one board dielectric layer 160 and a plurality of board interconnects 162.

The surface mount substrate 102 includes at least one dielectric layer 120 (e.g., substrate dielectric layer), a plurality of interconnects 122 (e.g., substrate interconnects), a solder resist layer 140 and a solder resist layer 142. The integrated device 103 may be coupled to the surface mount substrate 102 through a plurality of solder interconnects 130. The integrated device 103 may be coupled to the surface mount substrate 102 through a plurality of pillar interconnects 132 and the plurality of solder interconnects 130. The integrated passive device 105 may be coupled to the surface mount substrate 102 through a plurality of solder interconnects 150. The integrated passive device 105 may be coupled to the surface mount substrate 102 through a plurality of pillar interconnects 152 and the plurality of solder interconnects 150.

The package (e.g., 100) may be implemented in a radio frequency (RF) package. The RF package may be a radio frequency front end (RFFE) package. A package (e.g., 100) may be configured to provide Wireless Fidelity (WiFi) communication and/or cellular communication (e.g., 2G, 3G, 4G, 5G). The package (e.g., 100) may be configured to support Global System for Mobile (GSM) Communications, Universal Mobile Telecommunications System (UMTS), and/or Long-Term Evolution (LTE). The package (e.g., 100) may be configured to transmit and receive signals having different frequencies and/or communication protocols.

Figure 2:
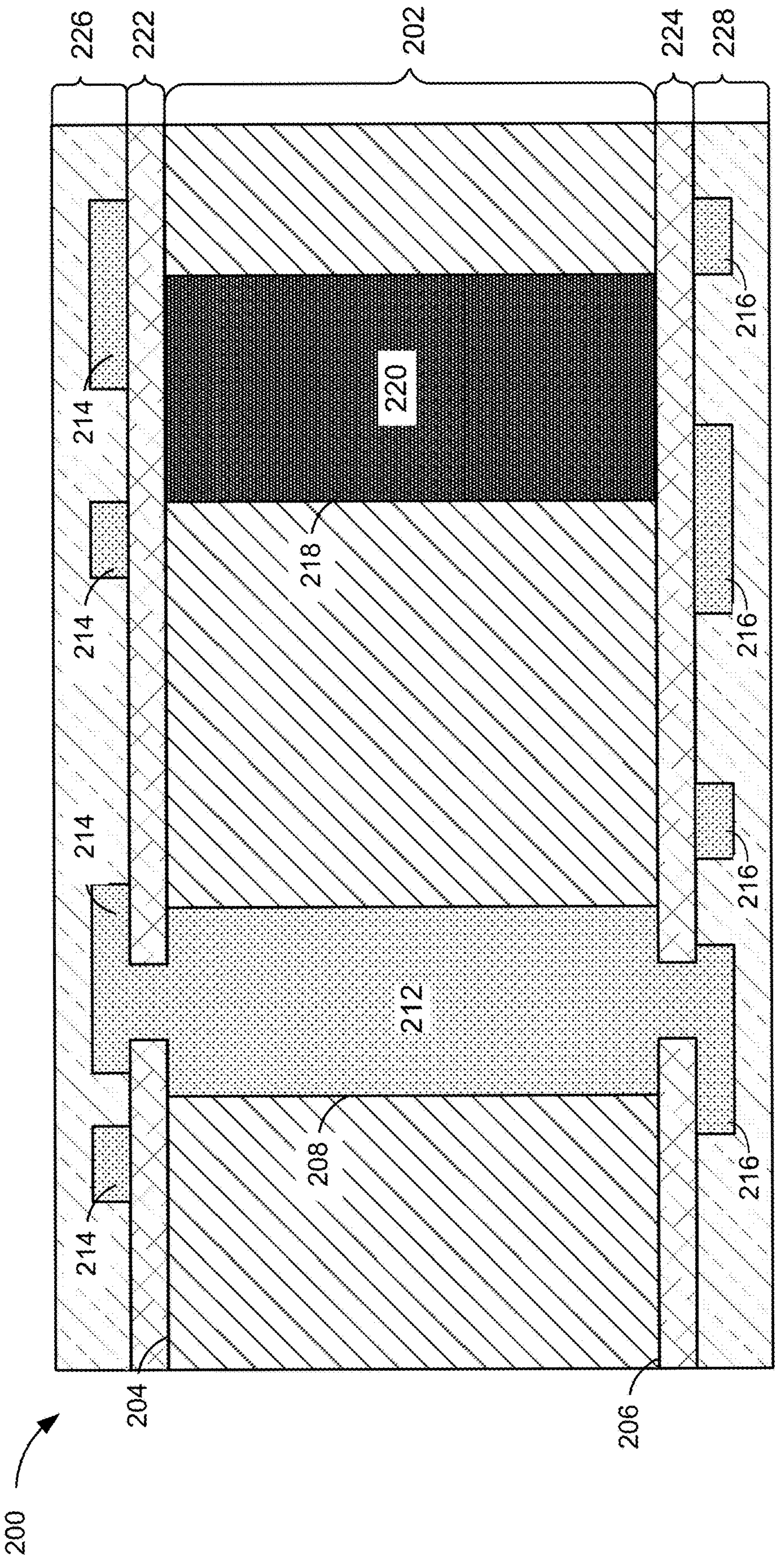
FIG. 2 is a partial cross-section of view of an inductor, according to aspects of the disclosure.

According to aspects of the disclosure, the integrated passive device 105 may be an inductor that is formed in a substrate. FIG. 2 is a partial cross-section of view of an inductor 200, according to aspects of the disclosure. In this example, the inductor 200 includes a substrate 202 having a first planar surface 204 and a second planar surface 206 opposite the first planar surface 204. The substrate may be formed from glass, silicon, epoxy mold, etc. The substrate 202 also includes a plurality of vias 208 (only one shown in FIG. 2) that are disposed through the substrate 202. The plurality of vias 208 are filled with a conductive metal 212 (e.g., copper, silver, gold, etc.). The conductive metal 212 of the plurality of vias 208, in turn, are connected to a first patterned metallization layer 214 overlying the first planar surface 204 of the substrate 202. Likewise, the conductive metal 212 of the plurality of vias forming the via structure 218 are connected to a second patterned metallization layer 216 overlying the second planar surface 206 of the substrate 202.

In addition to the plurality of vias 208, the substrate also includes a via structure 218 disposed therethrough. The via structure 218, in turn, is filled with a magnetic material 220 (e.g., magnetic paste, neodymium-based magnetic paste, CoZrTa (CZT), AFTINNOVA®, etc.). The substrate 202 may electrically insulate the magnetic material 220 from the conductive metal 212 in the plurality of vias 208. A first dielectric layer 222 (e.g., polyimide or other polymer) may be disposed over the first planar surface 204 of the substrate 202 to insulate the magnetic material 220 in the via structure 218 from the first patterned metallization layer 214. Additionally, a second dielectric layer 224 may be disposed over the second planar surface 206 of the substrate 202 to insulate the magnetic material 220 filling the via structure 218 from the second patterned metallization layer 216. In an aspect, the first patterned metallization layer 214 and second patterned metallization layer 216 may be disposed directly in the planar surfaces 204 and 206 if the magnetic material 220 is not electrically conductive.

The structure of the inductor 200 includes a winding that is disposed about a magnetic core structure. The magnetic core structure may be formed from the magnetic material 220 in the via structure 218, while the winding may be formed by the conductive metal 212 in the plurality of vias 208 that are interconnected by the patterned metallization layers 214, 216. The disclosed inductor provides an inductor structure that is compact and readily manufactured while also resulting in an inductor having a high inductance despite its compactness.

A first passivation layer 226 (e.g., polyimide or other polymer) may be disposed over the first patterned metallization layer 214 and first dielectric layer 222. Similarly, a second passivation layer 228 may be disposed over the second patterned metallization layer 216 and second dielectric layer 224. The passivation layers 226 and 228 protect the corresponding patterned metallization layers 214 and 216 and dielectric layers 222 and 224. In an aspect, the inductor 200 may be integrated with other passive and/or active components formed in the substrate 202 (not shown). Additionally, or in the alternative, the inductor 200 may be adapted for mounting to another substrate, in which case one or both of the passivation layers 226 and 228 may be patterned to expose portions of the patterned metallization layers 214 and 216 for connection to electrical contacts that facilitate connection of the inductor 200 to the other substrate.

Figure 3A:
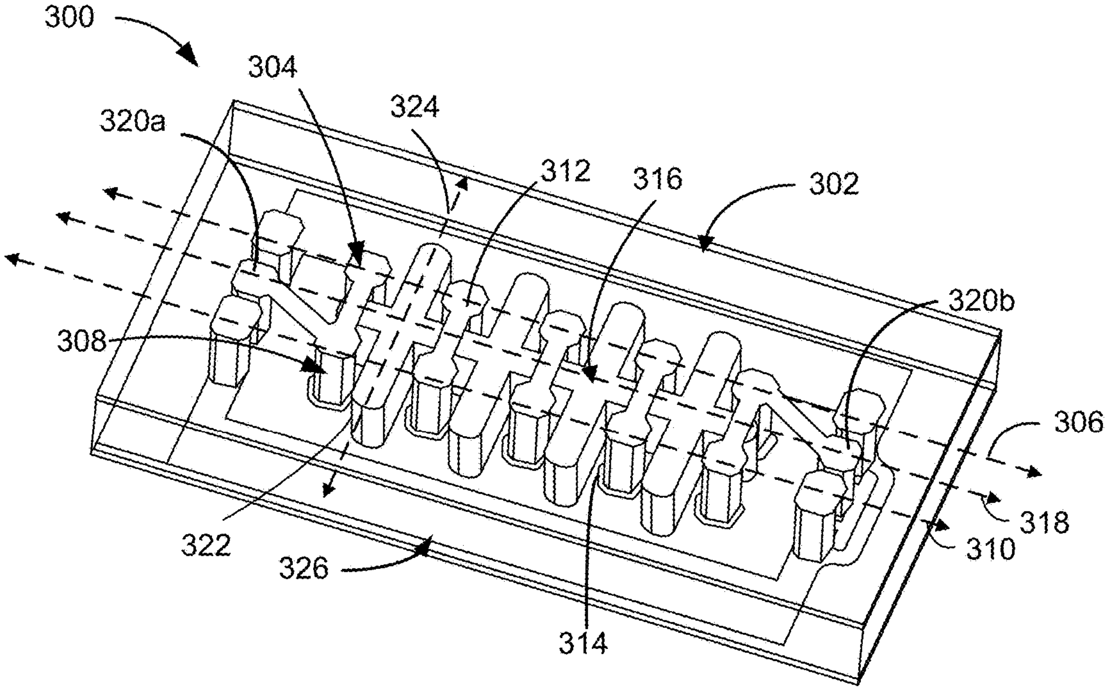
FIG. 3A and FIG. 3B (collectively FIG. 3) show an example of an inductor, in accordance with aspects of the disclosure.
Figure 3B:
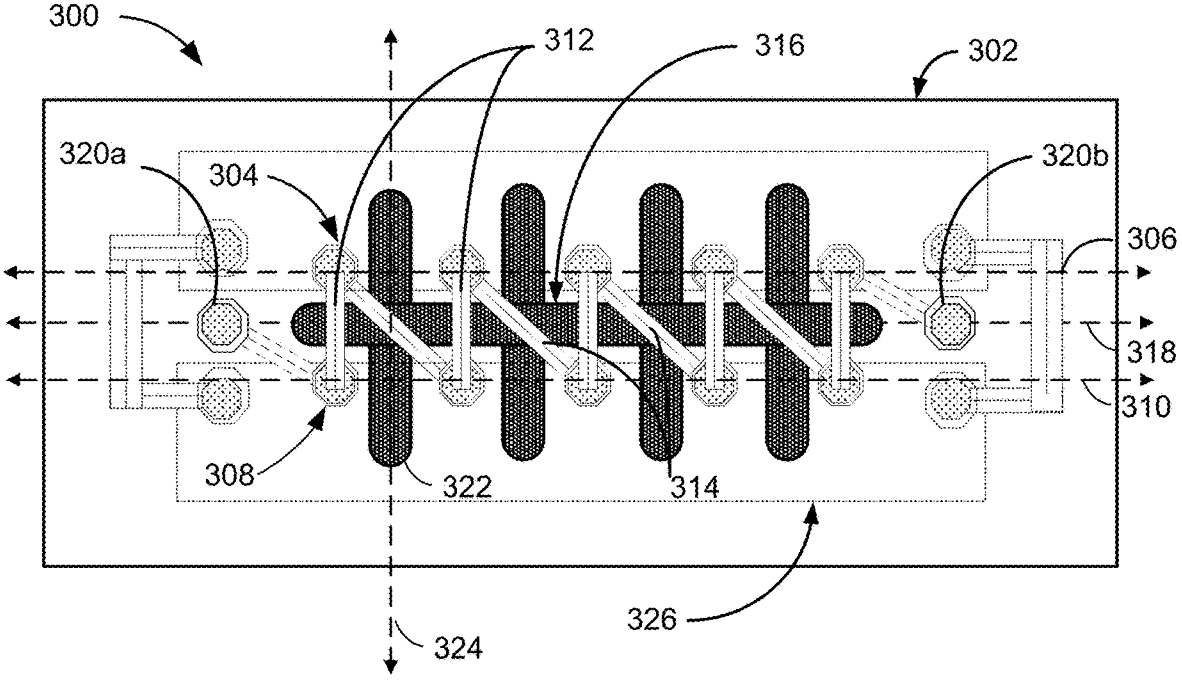

FIG. 3A and FIG. 3B (collectively FIG. 3) show an example of an inductor 300, in accordance with certain aspects of the disclosure. More particularly, FIG. 3A is a perspective view of the inductor 300, while FIG. 3B is a top view of the inductor 300.

In this example, the inductor 300 is formed in a substrate 302. A first row of vias 304 are disposed through the substrate 302 and filled with a conductive metal. The vias of the first row of vias 304 may be arranged along a common longitudinal axis 306. A second row of vias 308 are also disposed through the substrate 302 and filled with the conductive metal. The vias of the second row of vias 308 may be arranged along a common longitudinal axis 310.

In this example, the second row of vias 308 is laterally displaced from the first row of vias 304. The first row of vias 304 and second row of vias 308 are symmetrically arranged in the substrate 302, where each via of the first row of vias 304 is spaced from a corresponding via of the second row of vias 308.

The conductive metal at the first side of the vias of the first row of vias 304 and conductive metal at the first side of the vias of the second row of vias 308 are interconnected by a first patterned metallization layer 312 that overlies a first planar surface of the substrate 302. The first patterned metallization layer 312 connects the conductive metal in each via of the first row of vias 304 with the conductive metal in the corresponding via of the second row of vias 308 lying directly across from the via of the first row of vias 304.

Similarly, a conductive metal at the second side of the vias of the first row of vias 304 and conductive metal at the second side of the vias of the second row of vias 308 are interconnected by a second patterned metallization layer 314 that overlies a second planar surface of the substrate 302. The second patterned metallization layer 314 connects the conductive metal in each via of the first row of vias 304 with the conductive metal in the corresponding via of the second row of vias 308 lying at a diagonal with the via of the first row of vias 304.

As noted herein, a via structure is disposed through the substrate and filled with a magnetic material to form the magnetic core of the inductor. In FIG. 3, the via structure is in the form of a longitudinal trench 316 extending along a longitudinal axis 318 of the substrate 302 between the first and second row of vias 304, 308. The conductive metal in the first and second row of vias 304, 308 and the first and second patterned metallization layers 312, 314 form a winding of the inductor that surrounds the magnetic core formed by the magnetic material in the longitudinal trench 316. In this example, the ends of the winding are terminated at metal filled vias 320*a* and 320*b*.

In accordance with certain aspects of the disclosure, the inductance of the inductor 300 may be enhanced by filling, with the magnetic material, a plurality of transverse trenches 322 arranged along respective transverse axes 324 between the vias of the first and second rows of vias 304, 308. The transverse trenches 322 may extend to a length that spans the first and second rows of vias 304, 308. In an aspect, the longitudinal trench 316 and transverse trenches 322 may be formed as a single via structure through the substrate 302 and concurrently filled with the magnetic material in the same processing operation.

In certain applications, it may be desirable to isolate the inductor 300 from other components of an electrical circuit with which it is integrated. To this end, certain aspects of the disclosure include a ground plane structure 326 formed from a conductive metal that at least partially surrounds portions of the inductor 300.

Figure 4A:
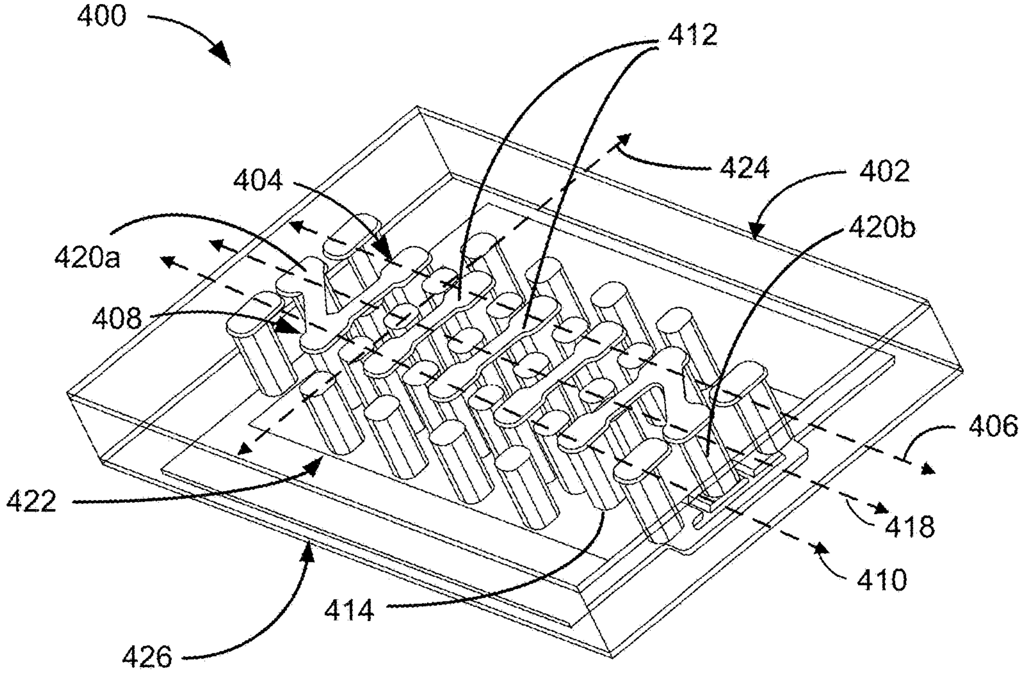
FIG. 4A and FIG. 4B (collectively FIG. 4) show another example of an inductor, in accordance with certain aspects of the disclosure.
Figure 4B:
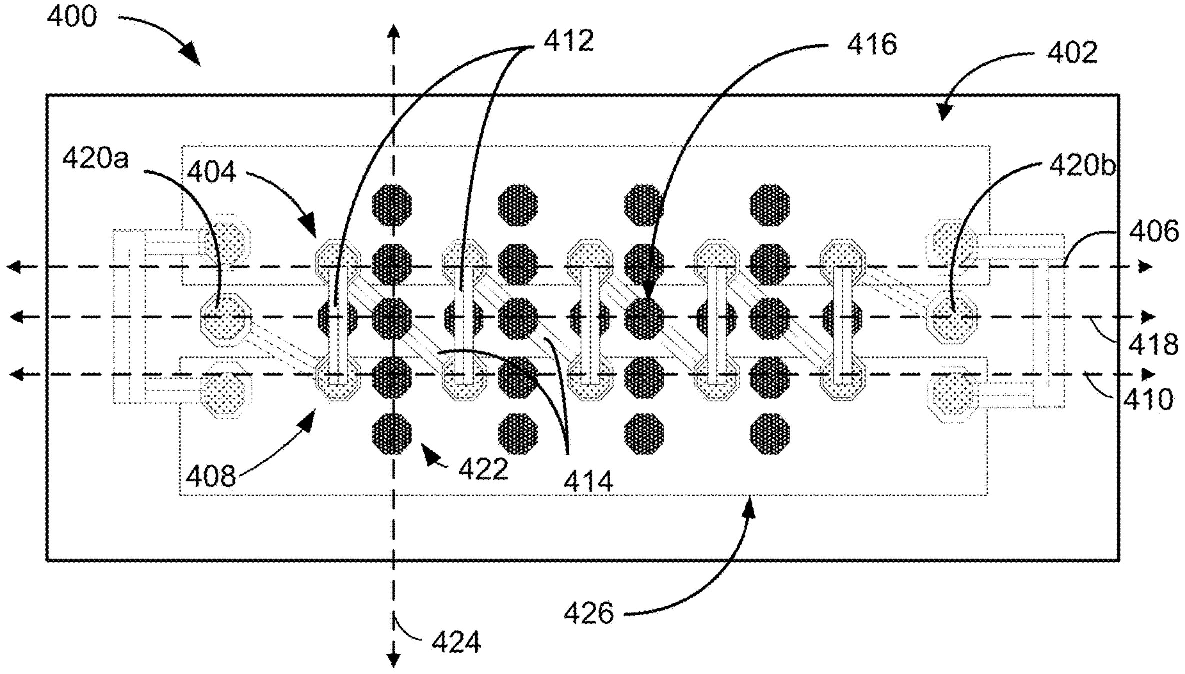

FIG. 4A and FIG. 4B (collectively FIG. 4) show another example of an inductor 400, in accordance with certain aspects of the disclosure. More particularly, FIG. 4A is a perspective view of the inductor 400 while FIG. 4B is a top view of the inductor 400.

In this example, the inductor 400 is formed in a substrate 402. A first row of vias 404 are disposed through the substrate 402 and filled with a conductive metal. The vias of the first row of vias 404 may be arranged along a common longitudinal axis 406. A second row of vias 408 are also disposed through the substrate 402 and filled with the conductive metal. The vias of the second row of vias 408 may be arranged along a common longitudinal axis 410.

In this example, the second row of vias 408 is laterally displaced from the first row of vias 404. In an aspect, the first row of vias 404 and second row of vias 408 are symmetrically arranged in the substrate 402, where each via of the first row of vias 404 is spaced from a corresponding via of the second row of vias 408.

The conductive metal at the first side of the vias of the first row of vias 404 and conductive metal at the first side of the vias of the second row of vias 408 are interconnected by a first patterned metallization layer 412 that overlies a first planar surface of the substrate 402. The first patterned metallization layer 412 connects the conductive metal in each via of the first row of vias 404 with the conductive metal in the corresponding via of the second row of vias 408 lying directly across from the via of the first row of vias 404.

Similarly, a conductive metal at the second side of the vias of the first row of vias 404 and conductive metal at the second side of the vias of the second row of vias 408 are interconnected by a second patterned metallization layer 414 that overlies a second planar surface of the substrate 402. The second patterned metallization layer 414 connects the conductive metal in each via of the first row of vias 404 with the conductive metal in the corresponding via of the second row of vias 408 lying at a diagonal with the via of the first row of vias 404.

As noted herein, a via structure is disposed through the substrate and filled with a magnetic material to form the magnetic core of the inductor. Unlike the via structure shown in FIG. 3, the via structure in FIG. 4 is in the form of a longitudinal row of vias 416 filled with the magnetic material. The longitudinal rows of vias 416 extends along a longitudinal axis 418 of the substrate 402 between the first and second row of vias 404 and 408. The conductive metal in the first and second row of vias 404, 408 and the first and second patterned metallization layers 412 and 414 form a winding of the inductor that surrounds the magnetic core formed by the magnetic material in the longitudinal row of vias 416. In this example, the ends of the winding are terminated at metal filled vias 420*a* and 420*b*.

In accordance with certain aspects of the disclosure, the inductance of the inductor 400 may be enhanced by filling, with the magnetic material, a plurality of transverse vias 422 arranged along respective transverse axes 424 between the vias of the first and second rows of vias 404 and 408. The transverse rows of vias 422 may extend to a length that spans the first and second rows of vias 404 and 408. The longitudinal row of vias 416 and transverse row of vias 422 may be formed through the substrate 402 in the same processing operation and also concurrently filled with the magnetic material in the same processing operation.

In certain applications, it may be desirable to isolate the inductor 400 from other components of an electrical circuit with which it is integrated. To this end, certain aspects of the disclosure include a ground plane structure 426 formed from a conductive metal that at least partially surrounds portions of the inductor 400.

In order to fully illustrate aspects of the design of the present disclosure, methods of fabrication are presented. Other methods of fabrication are possible, and discussed fabrication methods are presented only to aid understanding of the concepts disclosed herein.

Figure 5A:
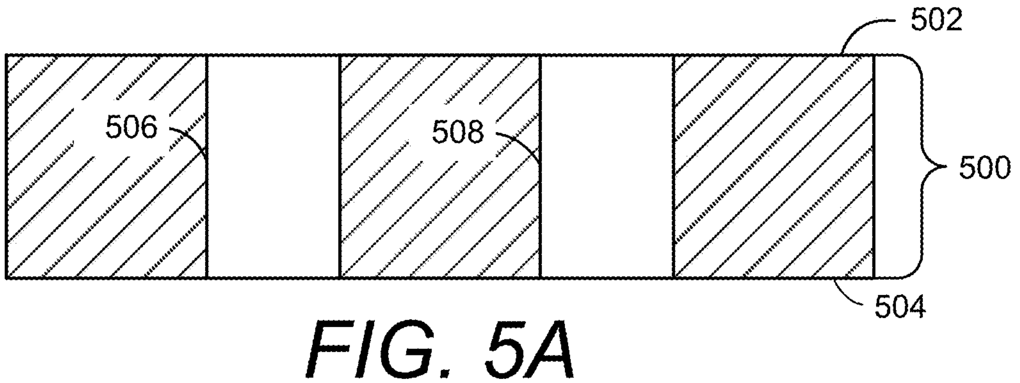
FIG. 5A through FIG. 5I (collectively FIG. 5) depict examples of processing steps that may be used to fabricate an inductor, according to aspects of the disclosure.

FIG. 5A through FIG. 5I (collectively FIG. 5) depict examples of processing steps that may be used to fabricate an inductor, according to aspects of the disclosure. In FIG. 5A, a plurality of vias 506 (only one shown) may be disposed through a substrate 500 having first and second planar surfaces 502, 504. The plurality of vias 506 form first and second rows of vias. One or more further vias 508 are disposed through the substrate 500 form a via structure. In an aspect, the vias 506 and 508 may be formed during a single drilling or etching operation.

Figure 5B:
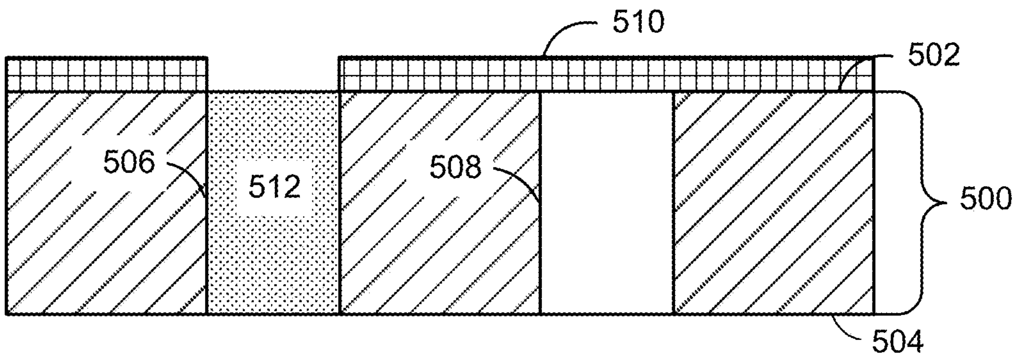

In FIG. 5B, a layer 510 (e.g., photoresist layer) is formed over the first planar surface 502 of the substrate 500. The layer 510 is patterned to expose the plurality of vias 506 while covering the vias 508 of the via structure. A metallization process (e.g., electrochemical deposition, physical vapor deposition, etc.) may be used to deposit a conductive metal 512 in the vias 506. Since the layer 510 overlies the vias 508, no conductive metal is deposited in the vias 508.

Figure 5C:
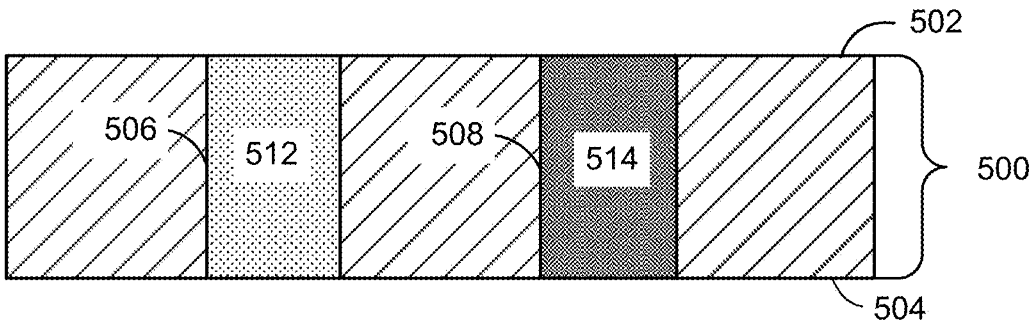

In FIG. 5C, the layer 510 is stripped thereby exposing the vias 508. The vias 508 are filled with a magnetic material 514. The magnetic material 514 may be applied as a magnetic paste over the first planar surface 502 of the substrate 500. The magnetic material may then be removed from the first planar surface 502 using, for example, a chemical etching and/or grinding process (e.g., a chemical mechanical polishing process, etc.).

Figure 5D:
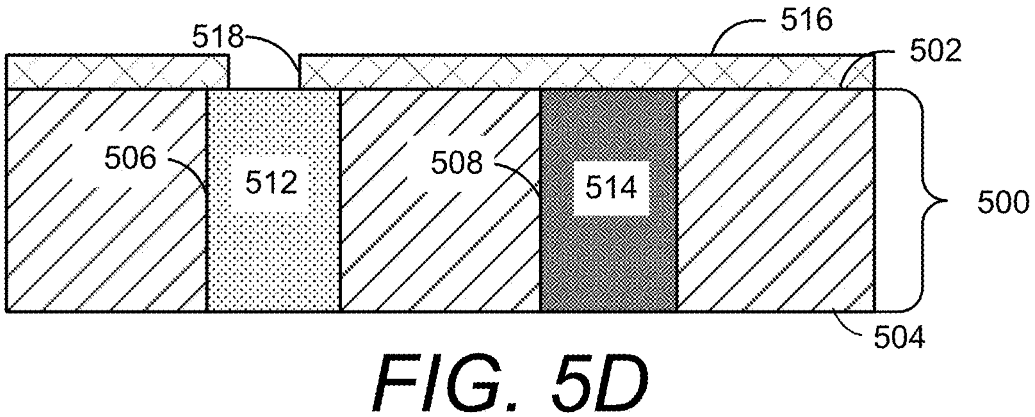

In FIG. 5D, a dielectric layer 516 is deposited over the first planar surface 502 of the substrate 500. The dielectric layer 516 is patterned to provide openings 518 over the conductive metal 512 in the vias 506.

Figure 5E:
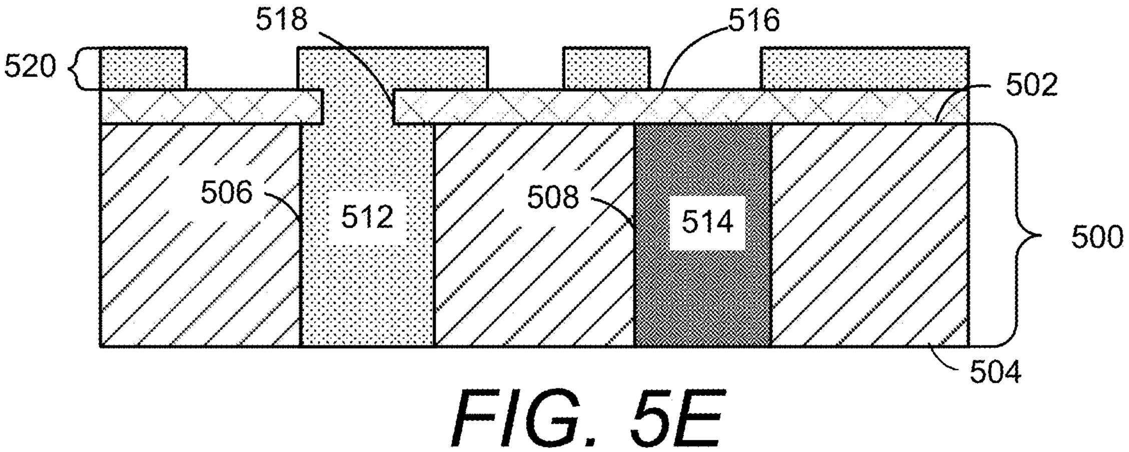

In FIG. 5E, a first patterned metallization layer 520 is formed over the patterned dielectric layer 516. In an aspect, openings 518 are filled with the conductive metal while applying the first patterned metallization layer 520 to provide a conductive path between the conductive metal 512 in the vias 506 and the first patterned metallization layer 520. The magnetic material 514 in the vias 508 may be electrically conductive but insulated from the conductive metal 512 in the vias 506 by the dielectric material forming the substrate 500. Additionally, the magnetic material 514 in the vias 508 may be electrically insulated from the first patterned metallization layer 520 by the dielectric layer 516.

The magnetic material 514 filling the vias 508 may be non-conductive. In such instances, the first patterned metallization layer 520 may be deposited over the first planar surface 502 of the substrate 500 without the intermediate dielectric layer 516.

Figure 5F:
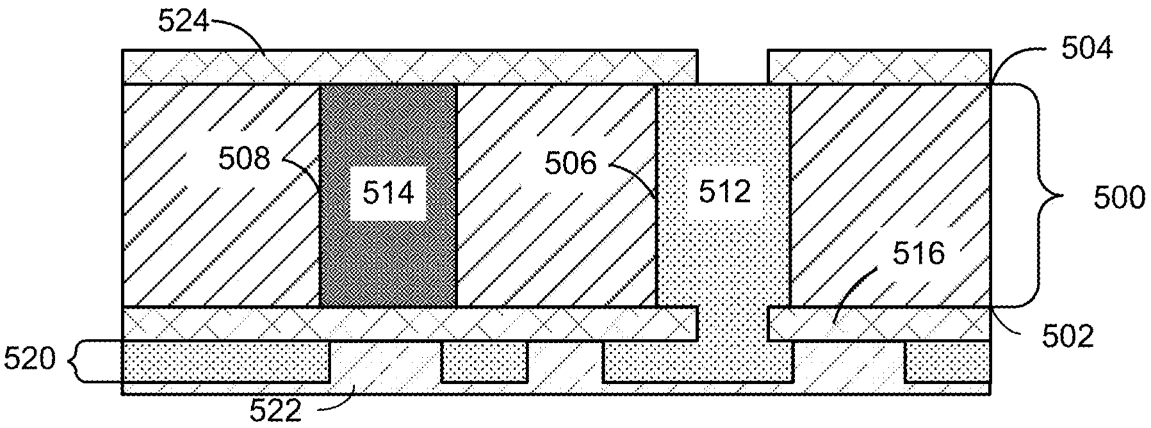

In FIG. 5F, a passivation layer 522 is formed over the first patterned metallization layer nor 520 and exposed portions of the first planar surface 502 of the substrate 500. The substrate 500 is flipped over to expose the second planar surface 504 for processing. In an aspect, a dielectric layer 524 is formed over the second planar surface 504 and patterned to expose areas overlying the conductive metal 512.

Figure 5G:
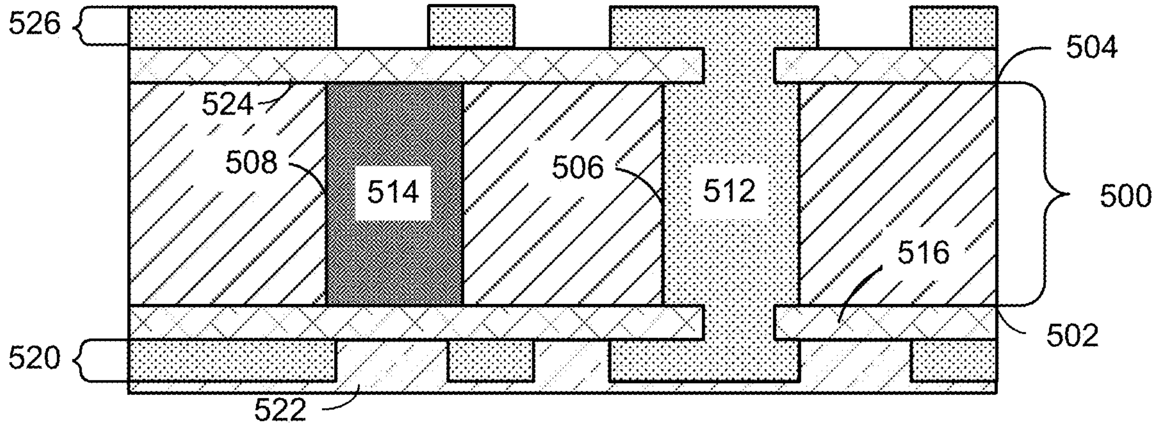

In FIG. 5G, a second patterned metallization layer 526 is formed over the patterned dielectric layer 524. The exposed areas overlying the conductive metal 512 of the vias are filled with the conductive metal while applying the second patterned metallization layer 526 to provide a conductive path between the conductive metal 512 in the vias 506 and the second patterned metallization layer 526.

Figure 5H:
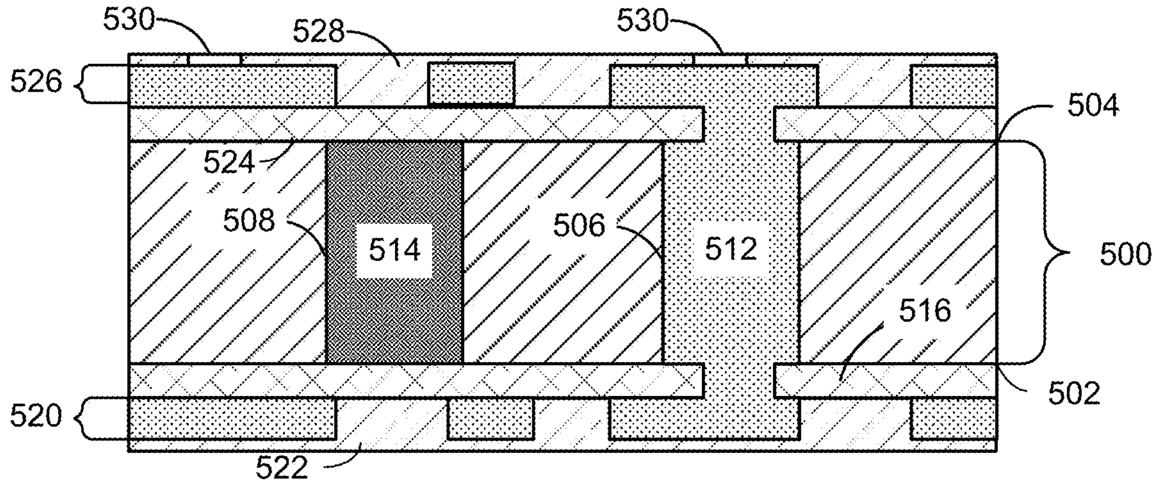
Figure 5I:
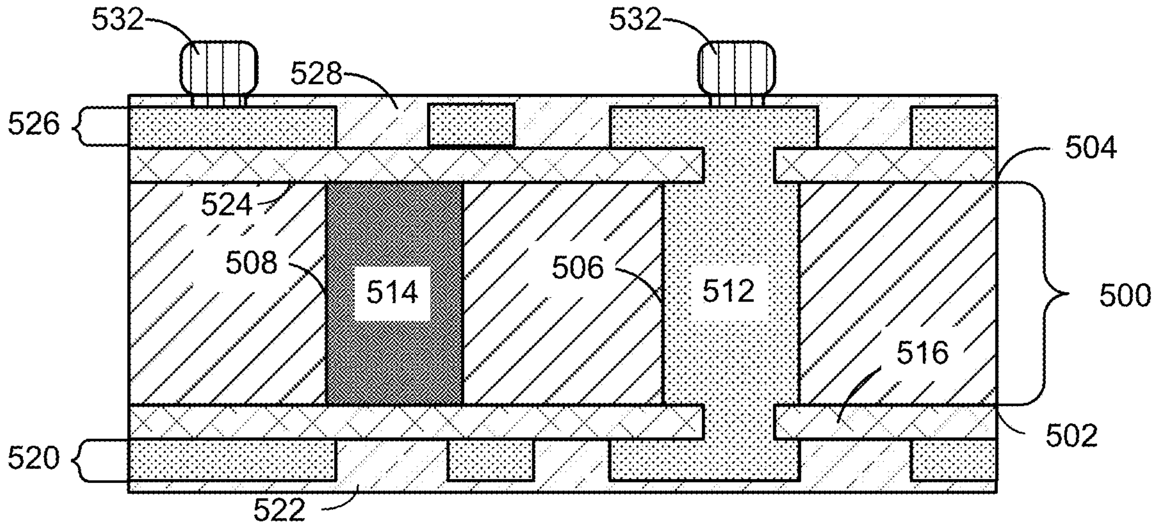

In FIG. 5H, a passivation layer 528 may be deposited over the second patterned metallization layer 526 and exposed portions of the dielectric layer 524. If the inductor is to be attached to an external electrical circuit, the dielectric layer 524 may be patterned to selectively expose areas 530 of conductive metal of the second patterned metallization layer 526. In such instances, as shown in FIG. 5I, a conductive metal is applied to form contacts 532 (e.g., solder bumps) to connect the second patterned metallization layer 526 with the external electrical circuit.

Figure 6:
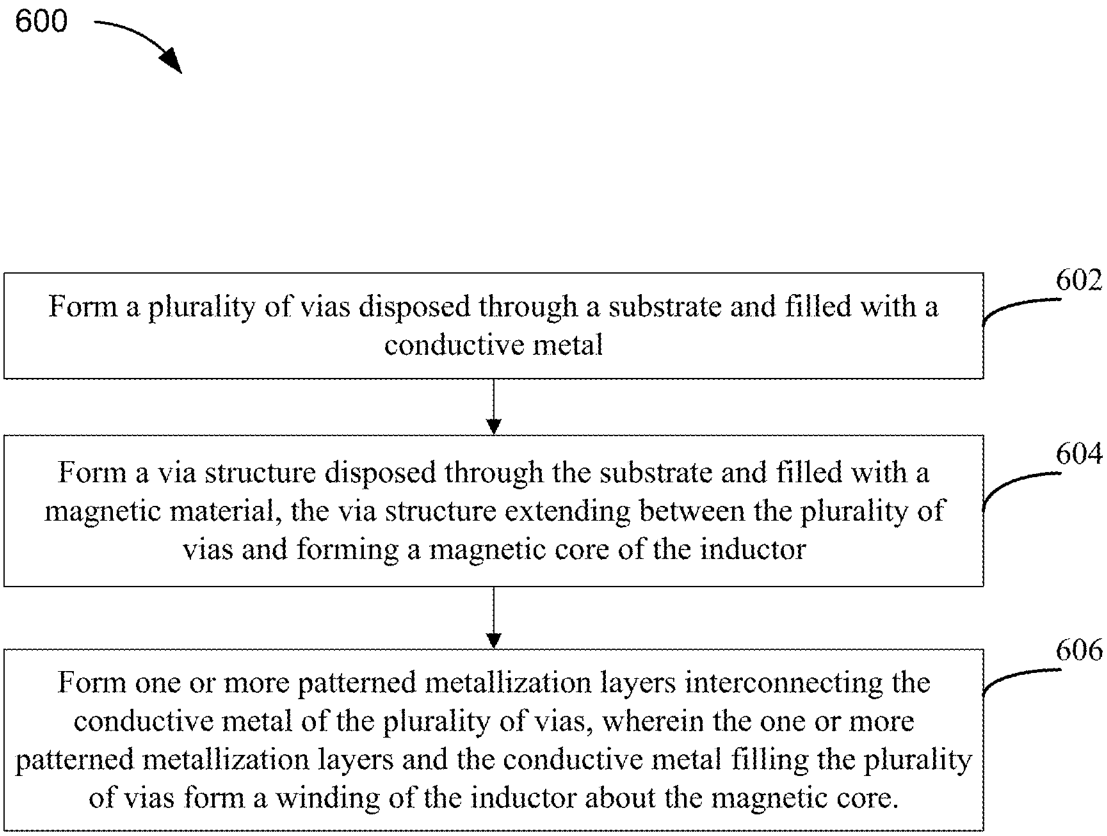
FIG. 6 shows an example of a method for fabricating an inductor, according to aspects of the disclosure.

FIG. 6 shows an example of a method 600 for fabricating an inductor, according to aspects of the disclosure. At operation 602, a plurality of vias disposed through a substrate are formed and filled with a conductive metal. At operation 604, a via structure disposed through the substrate and filled with a magnetic material is formed, the via structure extending between the plurality of vias and forming a magnetic core of the inductor. At operation 606, one or more patterned metallization layers interconnecting the conductive metal of the plurality of vias are formed. The operations of the method provide an inductor in which the one or more patterned metallization layers and the conductive metal filling the plurality of vias form a winding of the inductor about the magnetic core.

Figure 7:
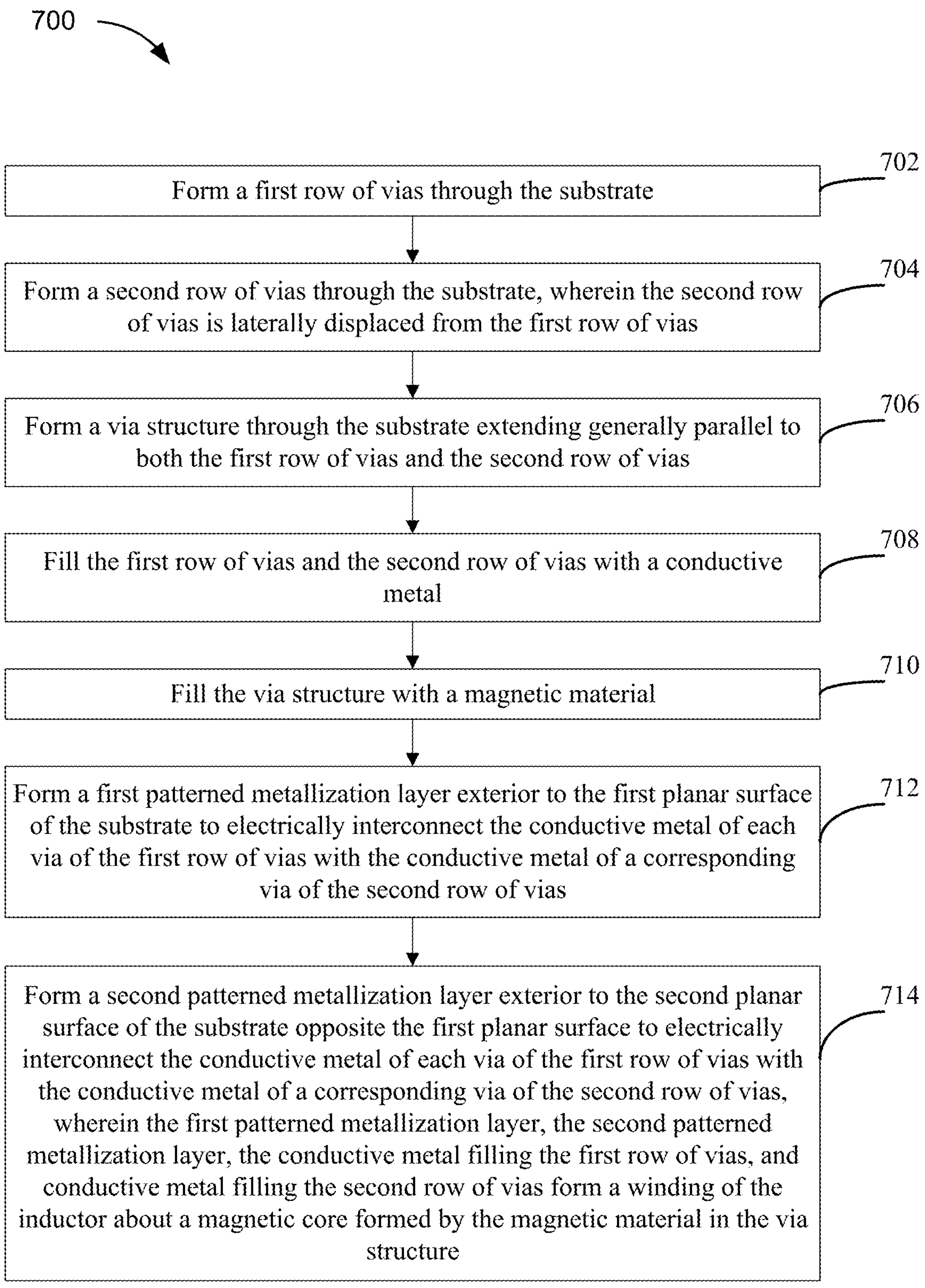
FIG. 7 shows an example of a method for fabricating an inductor, according to aspects of the disclosure.

FIG. 7 shows an example of a method 700 for fabricating an inductor, according to aspects of the disclosure. At operation 702, a first row of vias is formed through a substrate. At operation 704, a second row of vias are formed through the substrate, wherein the second rule of vias is laterally displaced from the first row of vias. At operation 706, a via structure is formed through the substrate that extends generally parallel to both the first row of vias and the second row vias. At operation 708, the first row of vias and the second row of vias are filled with a conductive metal. At operation 710, the via structure is filled with a magnetic material. At operation 712, a first patterned metallization layer is formed exterior to a first planar surface of the substrate to electrically interconnect the conductive metal of each via of the first row of vias with the conductive metal of a corresponding via of the second row of vias. At operation at 714, a second patterned metallization layer is formed exterior to a second planar surface of the substrate opposite the first planar surface to electrically interconnect the conductive metal of each via of the first row of vias with the conductive metal of a corresponding via of the second row of vias. The first patterned metallization layer, the second patterned metallization layer, the conductive metal filling the first row of vias, and conductive metal filling the second row of vias form a winding of the inductor about a magnetic core formed by the magnetic material in the via structure.

Technical advantages of the methods 600 and 700 include the fabrication of an inductor having a compact structure that is readily manufactured while also resulting in an inductor having a high inductance despite its compactness.

Figure 8:
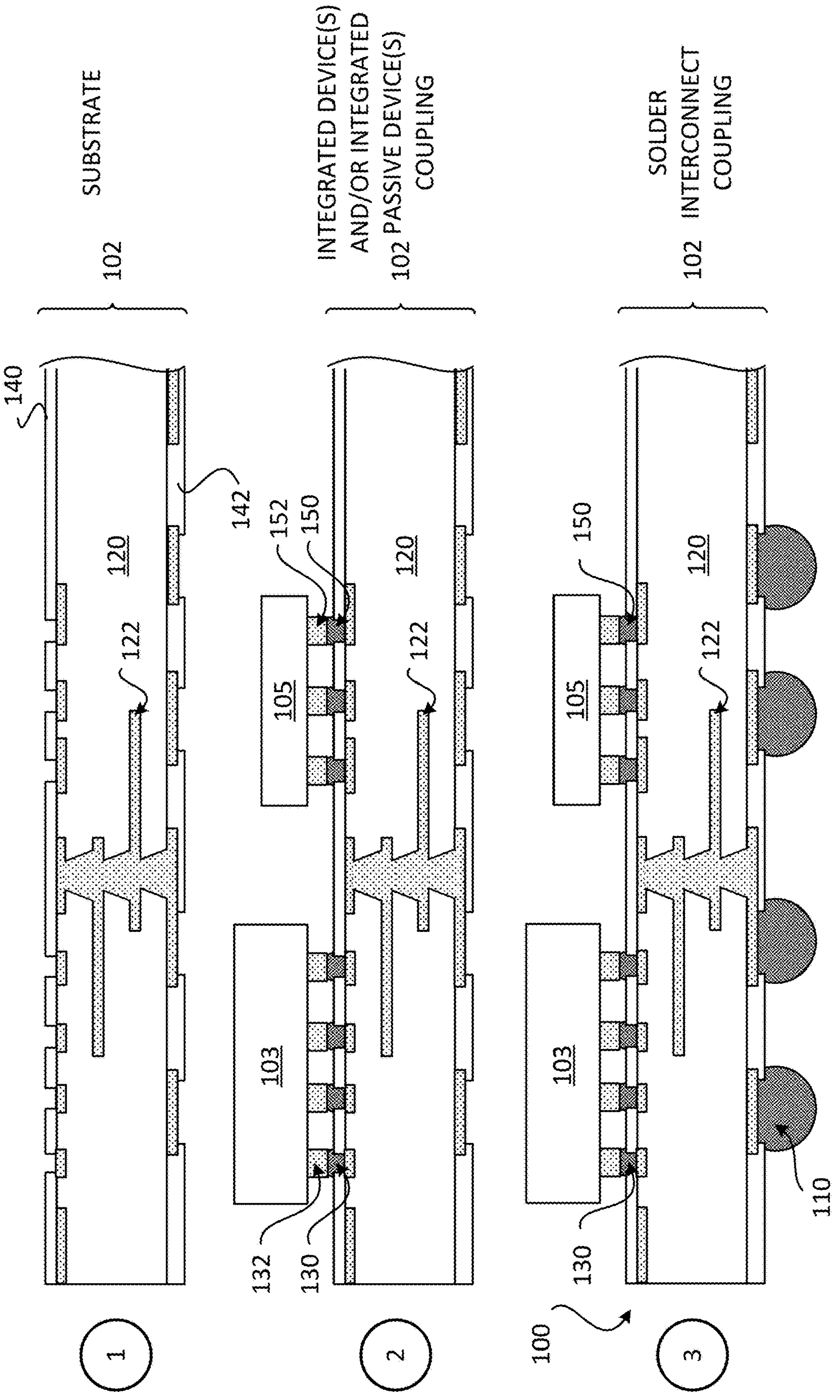
FIG. 8 illustrates an exemplary flow diagram of a method for fabricating a package that includes a substrate, an integrated device and an integrated passive device.

FIG. 8 illustrates an exemplary sequence for providing or fabricating a package that includes an integrated device comprising a magnetic layer and/or an integrated passive device comprising a magnetic layer. In some implementations, the sequence of FIG. 8 may be used to provide or fabricate the package 100 that includes an integrated device and/or the integrated passive device.

It should be noted that the sequence of FIG. 8 may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIG. 8 may be used to fabricate one package or several packages at a time (as part of a wafer).

Stage 1, as shown in FIG. 8, illustrates a state after the substrate 102 is provided. The substrate 102 may be provided by a supplier or fabricated. The substrate 102 includes at least one dielectric layer 120 and a plurality of interconnects 122, a solder resist layer 140 and a solder resist layer 142. The substrate 102 may include an embedded trace substrate (ETS). In some implementations, the at least one dielectric layer 120 may include prepreg layer(s).

Stage 2 illustrates a state after the integrated device 103 is coupled to a first surface (e.g., top surface) of the substrate 102. The integrated device 103 may be coupled to the substrate 102 through a plurality of pillar interconnects 132 and a plurality of solder interconnects 130. In some implementations, the plurality of pillar interconnects 132 may be optional. The plurality of solder interconnects 130 are coupled to the plurality of interconnects 122. A solder reflow process may be used to couple the integrated device 103 to the plurality of interconnects 122 through the plurality of solder interconnects 130.

Stage 2 also illustrates a state after the integrated passive device 105 is coupled to the first surface (e.g., top surface) of the substrate 102. The integrated passive device 105 may be coupled to the substrate 102 through a plurality of pillar interconnects 152 and a plurality of solder interconnects 150. In some implementations, the plurality of pillar interconnects 152 may be optional. The plurality of solder interconnects 150 are coupled to the plurality of interconnects 122. A solder reflow process may be used to couple the integrated passive device 105 to the plurality of interconnects 122 through the plurality of solder interconnects 150.

Stage 3 illustrates a state after a plurality of solder interconnects 110 are couped to the substrate 102. The plurality of solder interconnects 110 may be couple to interconnects that are located over a second surface of the at least one dielectric layer 120. A solder reflow process may be used to couple the plurality of solder interconnects 110 to the substrate 102. Stage 3 may illustrate the package 100. The packages (e.g., 100) described in the disclosure may be fabricated one at a time or may be fabricated together as part of one or more wafers and then singulated into individual packages.

Figure 9:
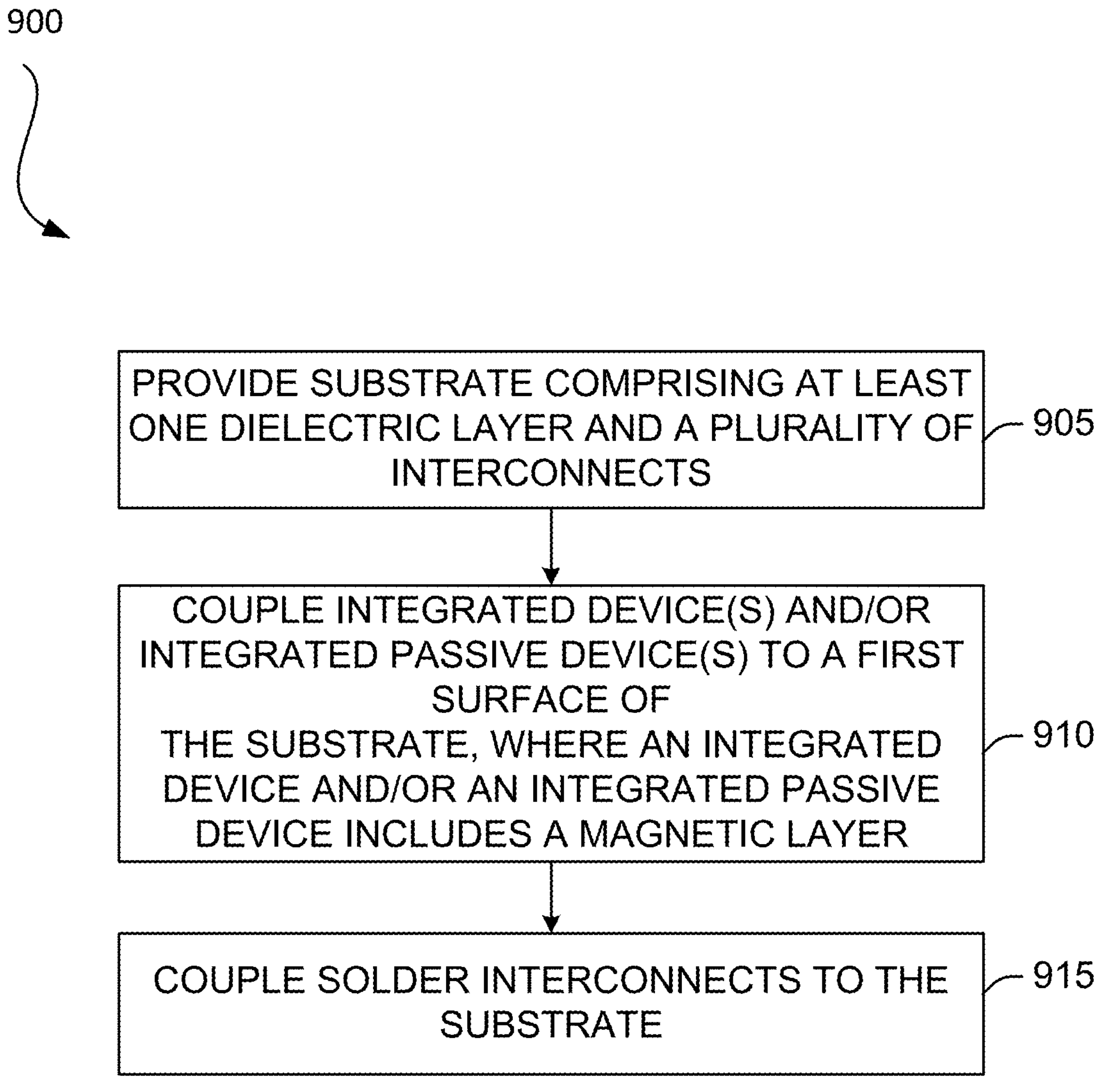
FIG. 9 illustrates an exemplary flow diagram of method for fabricating a package that includes a substrate, an integrated device and an integrated passive device.

In some implementations, fabricating a package that includes an integrated device comprising a magnetic layer and/or an integrated passive device comprising a magnetic layer, includes several processes. FIG. 9 illustrates an exemplary flow diagram of a method 900 for providing or fabricating package that includes an integrated device comprising a magnetic layer and/or an integrated passive device comprising a magnetic layer. In some implementations, the method 900 of FIG. 9 may be used to provide or fabricate the package 100 of FIG. 1 described in the disclosure. However, the method 900 may be used to provide or fabricate any of the packages described in the disclosure.

It should be noted that the method of FIG. 9 may combine one or more processes in order to simplify and/or clarify the method for providing or fabricating a package that includes an integrated device comprising a magnetic layer and/or an integrated passive device comprising a magnetic layer. In some implementations, the order of the processes may be changed or modified.

The method provides (at 905) a substrate (e.g., 102). The substrate 102 may be provided by a supplier or fabricated. The substrate 102 includes at least one dielectric layer 120, and a plurality of interconnects 122. The substrate 102 may include an embedded trace substrate (ETS). In some implementations, the at least one dielectric layer 120 may include prepreg layers. Stage 1 of FIG. 8 illustrates and describes an example of providing a substrate with escape interconnects.

The method couples (at 910) at least one integrated device (e.g., 103) to the first surface of the substrate (e.g., 102). For example, the integrated device 103 may be coupled to the substrate 102 through the plurality of pillar interconnects 132 and the plurality of solder interconnects 130. The plurality of pillar interconnects 132 may be optional. The plurality of solder interconnects 130 are coupled to the plurality of interconnects 122. A solder reflow process may be used to couple the integrated device 103 to the plurality of interconnects through the plurality of solder interconnects 130.

The method also couples (at 910) at least one integrated passive device (e.g., 105) to the first surface of the substrate (e.g., 102). For example, the integrated passive device 105 may be coupled to the substrate 102 through the plurality of pillar interconnects 152 and the plurality of solder interconnects 150. The plurality of pillar interconnects 152 may be optional. The plurality of solder interconnects 150 are coupled to the plurality of interconnects 122. A solder reflow process may be used to couple the integrated passive device 105 to the plurality of interconnects through the plurality of solder interconnects 150. Stage 2 of FIG. 8 illustrates and describes an example of an integrated device and an integrated passive device coupled to a substrate.

The method couples (at 915) a plurality of solder interconnects (e.g., 110) to the second surface of the substrate (e.g., 102). A solder reflow process may be used to couple the plurality of solder interconnects 110 to the substrate. Stage 3 of FIG. 8 illustrates and describes an example of coupling solder interconnects to the substrate.

Figure 10:
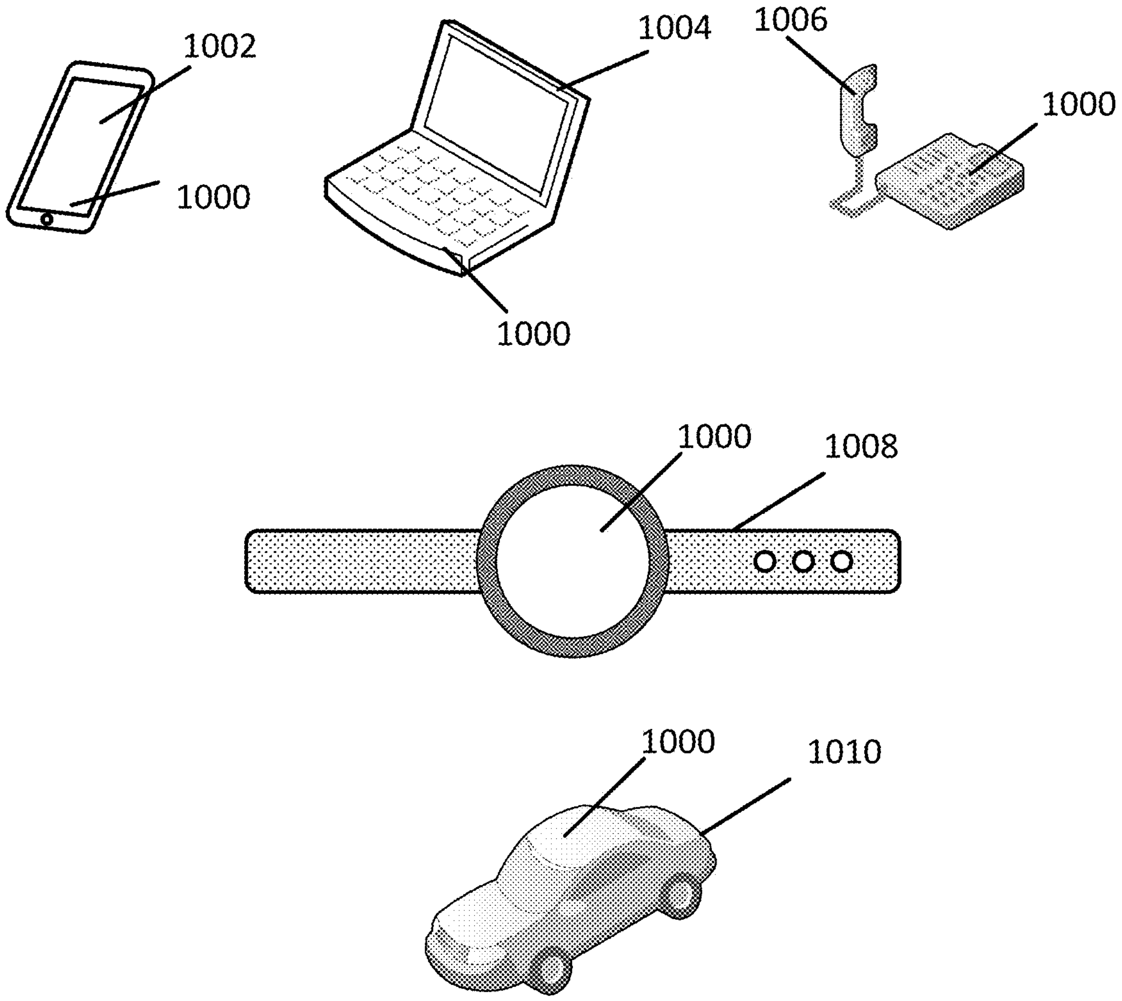
FIG. 10 illustrates various electronic devices that may integrate a die, an electronic circuit, an integrated device, an integrated passive device (IPD), a passive component, a package, and/or a device package described herein.

FIG. 10 illustrates various electronic devices that may be integrated with any of the aforementioned devices, integrated devices, integrated circuit (IC) packages, integrated circuit (IC) devices, semiconductor devices, integrated circuits, dies, interposer packages, package-on-package (POP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IOT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1 through 10 may be rearranged and/or combined into a single component, process, feature or function or embodied in several components, processes, or functions. Additional elements, components, processes, and/or functions may also be added without departing from the disclosure. It should also be noted FIGS. 1 through 10 and their corresponding descriptions in the present disclosure are not limited to dies and/or ICs. In some implementations, FIGS. 1 through 10 and their corresponding descriptions may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

Implementation examples are described in the following numbered aspects:

Aspect 1. A device including an inductor, the inductor comprising: a substrate; a plurality of vias disposed through the substrate and filled with a conductive metal; a via structure disposed through the substrate and extending between the plurality of vias, wherein the via structure is filled with a magnetic material to form a magnetic core of the inductor; and one or more patterned metallization layers interconnecting the conductive metal of the plurality of vias; wherein the one or more patterned metallization layers and the conductive metal filling the plurality of vias form a winding of the inductor about the magnetic core.

Aspect 2. The device of aspect 1, wherein the via structure comprises: a longitudinal trench displaced from and extending substantially along a length the plurality of vias.

Aspect 3. The device of aspect 2, wherein the inductor further comprises: a plurality of transverse trenches filled with the magnetic material and extending generally perpendicular to the longitudinal trench.

Aspect 4. The device of aspect 1, wherein the via structure comprises: a longitudinal row of vias disposed between the plurality of vias.

Aspect 5. The device of aspect 4, wherein the inductor further comprises: a plurality of transverse rows of vias filled with the magnetic material and extending generally perpendicular to the longitudinal row of vias.

Aspect 6. The device of any of aspects 1 to 5, wherein the device is selected from a group consisting of: a music player; a video player; an entertainment unit; a navigation device; a communications device; a mobile device; a mobile phone; a smartphone; a personal digital assistant; a fixed location terminal; a tablet computer, a computer; a wearable device; a laptop computer; a server; an internet of things (IOT) device; and a device in an automotive vehicle.

Aspect 7. A device including an inductor, the inductor comprising: a substrate having a first planar surface and a second planar surface opposite the first planar surface; a first row of vias disposed through the substrate and filled with a conductive metal; a second row of vias disposed through the substrate and filled with the conductive metal, wherein the second row of vias is laterally displaced from the first row of vias; a via structure disposed through the substrate and extending generally parallel to both the first row of vias and the second row of vias, the via structure being filled with a magnetic material to form a magnetic core of the inductor that is electrically insulated from the conductive metal filling the first row of vias and the conductive metal filling the second row of vias; a first patterned metallization layer exterior to the first planar surface and interconnecting the conductive metal of each via of the first row of vias with the conductive metal of a corresponding via of the second row of vias; and a second patterned metallization layer exterior to the second planar surface and interconnecting the conductive metal of each via of the first row of vias with the conductive metal of a corresponding via of the second row of vias; wherein the first patterned metallization layer, the second patterned metallization layer, the conductive metal filling the first row of vias, and conductive metal filling the second row of vias form a winding of the inductor about the magnetic core.

Aspect 8. The device of aspect 7, wherein the via structure comprises: a longitudinal trench displaced from and extending substantially along a length of the first row of vias and the second row of vias.

Aspect 9. The device of aspect 8, wherein the inductor further comprises: a plurality of transverse trenches filled with the magnetic material and extending generally perpendicular to the longitudinal trench.

Aspect 10. The device of aspect 7, wherein the via structure comprises: a longitudinal row of vias disposed between the first row of vias and the second row of vias.

Aspect 11. The device of aspect 10, wherein the inductor further comprises: a plurality of transverse rows of vias filled with the magnetic material and extending generally perpendicular to the longitudinal row of vias.

Aspect 12. The device of any of aspects 7 to 11, wherein: the magnetic material is not electrically conductive.

Aspect 13. The device of aspect 12, wherein: the first patterned metallization layer is formed on the first planar surface of the substrate; and the second patterned metallization layer is formed on the second planar surface of the substrate.

Aspect 14. The device of any of aspects 7 to 13, the inductor further comprising: a first patterned insulating layer overlying the first planar surface of the substrate to electrically insulate the magnetic material filling the via structure from the first patterned metallization layer, the first patterned insulating layer having openings filled with the conductive metal to connect the first row of vias and second row of vias with the first patterned metallization layer; and a second patterned insulating layer overlying the second planar surface and electrically insulating the magnetic material filling the via structure from the first patterned metallization layer, the first patterned insulating layer having openings filled with the conductive metal to connect the first row of vias and second row of vias with the first patterned metallization layer.

Aspect 15. The device of any of aspects 7 to 14, wherein: the first row of vias is aligned along a first longitudinal axis of the substrate; the second row of vias is aligned along a second longitudinal axis of the substrate parallel to the first longitudinal axis; and the via structure extends along a third longitudinal axis of the substrate parallel to both the first longitudinal axis and second longitudinal axis.

Aspect 16. The device of any of aspects 7 to 15, wherein the device is selected from a group consisting of: a music player; a video player; an entertainment unit; a navigation device; a communications device; a mobile device; a mobile phone; a smartphone; a personal digital assistant; a fixed location terminal; a tablet computer, a computer; a wearable device; a laptop computer; a server; an internet of things (IOT) device; and a device in an automotive vehicle.

Aspect 17. A method of fabricating an inductor, comprising: forming a plurality of vias disposed through a substrate and filled with a conductive metal; forming a via structure disposed through the substrate and filled with a magnetic material, the via structure extending between the plurality of vias and forming a magnetic core of the inductor; and forming one or more patterned metallization layers interconnecting the conductive metal of the plurality of vias; wherein the one or more patterned metallization layers, the conductive metal filling the plurality of vias form a winding of the inductor about the magnetic core.

Aspect 18. The method of aspect 17, wherein the via structure comprises: a longitudinal trench displaced from and extending substantially along a length the plurality of vias.

Aspect 19. The method of aspect 18, further comprising: forming a plurality of transverse trenches filled with the magnetic material and extending generally perpendicular to the longitudinal trench.

Aspect 20. The method of aspect 17, wherein the via structure comprises: a longitudinal row of vias disposed between the plurality of vias.

Aspect 21. The method of aspect 20, further comprising: forming plurality of transverse rows of vias filled with the magnetic material and extending generally perpendicular to the longitudinal row of vias.

Aspect 22. A method of fabricating an inductor, comprising: forming a first row of vias through a substrate; forming a second row of vias through the substrate, wherein the second row of vias is laterally displaced from the first row of vias; forming a via structure through the substrate extending generally parallel to both the first row of vias and the second row of vias; filling the first row of vias and the second row of vias with a conductive metal; filling the via structure with a magnetic material; forming a first patterned metallization layer exterior to a first planar surface of the substrate to electrically interconnect the conductive metal of each via of the first row of vias with the conductive metal of a corresponding via of the second row of vias; and forming a second patterned metallization layer exterior to a second planar surface of the substrate opposite the first planar surface to electrically interconnect the conductive metal of each via of the first row of vias with the conductive metal of a corresponding via of the second row of vias; wherein the first patterned metallization layer, the second patterned metallization layer, the conductive metal filling the first row of vias, and conductive metal filling the second row of vias form a winding of the inductor about a magnetic core formed by the magnetic material in the via structure.

Aspect 23. The method of aspect 22, wherein: the first row of vias and the second row of vias are formed concurrently during a processing operation.

Aspect 24. The method of aspect 23, wherein: the via structure is formed during the processing operation concurrently with the first row of vias and the second row of vias.

Aspect 25. The method of claim 22, wherein forming the via structure comprises: forming a longitudinal trench displaced from and extending substantially along a length of the first row of vias and the second row of vias.

Aspect 26. The method of claim 25, further comprising: forming a plurality of transverse trenches extending generally perpendicular to the longitudinal trench; and filling the plurality of transverse trenches with the magnetic material.

Aspect 27. The method of aspect 22, wherein forming the via structure comprises: forming a longitudinal row of vias disposed between the first row of vias and the second row of vias.

Aspect 28. The method of aspect 27, further comprising: forming a plurality of transverse rows of vias extending generally perpendicular to the longitudinal row of vias; and filling the plurality of transverse rows of vias with the magnetic material.

Aspect 29. The method of any of aspects 22 to 28, further comprising: forming a first patterned insulating layer overlying the first planar surface of the substrate wherein the first patterned insulating layer is patterned to electrically insulate the magnetic material filling the via structure from the first patterned metallization layer while leaving openings over the first row of vias and the second row of vias; filling the openings of the first patterned insulating layer with the conductive metal to connect the conductive metal filling the first row of vias with the conductive metal filling the second row of vias with the first patterned metallization layer; forming a second patterned insulating layer overlying the second planar surface of the substrate wherein the second patterned insulating layer is patterned to electrically insulate the magnetic material filling the via structure from the second patterned metallization layer while leaving openings over the first row of vias and the second row of vias; and filling the openings of the first patterned insulating layer with the conductive metal to connect the conductive metal filling the first row of vias with the conductive metal filling the second row of vias with the first patterned metallization layer.

Aspect 30. The method of any of aspects 22 to 29, wherein: the first row of vias is aligned along a first longitudinal axis of the substrate; the second row of vias is aligned along a second longitudinal axis of the substrate parallel to the first longitudinal axis; and the via structure extends along a third longitudinal axis of the substrate parallel to both the first longitudinal axis and second longitudinal axis.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the detailed description above, it can be seen that different features are grouped together in examples. This manner of disclosure should not be understood as an intention that the example aspects have more features than are explicitly mentioned in each aspect. Rather, the various aspects of the disclosure may include fewer than all features of an individual example aspect disclosed. Therefore, the following aspects should hereby be deemed to be incorporated in the description, wherein each aspect by itself can stand as a separate example. Although each dependent aspect can refer in the aspects to a specific combination with one of the other aspects, the aspect(s) of that dependent aspect are not limited to the specific combination. It will be appreciated that other example aspects can also include a combination of the dependent aspect aspect(s) with the subject matter of any other dependent aspect or independent aspect or a combination of any feature with other dependent and independent aspects. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a aspect can be included in any other independent aspect, even if the aspect is not directly dependent on the independent aspect.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A device including an inductor, the inductor comprising:

a substrate;

a plurality of vias disposed through the substrate and filled with a conductive metal, wherein the plurality of vias comprises a first row of vias aligned along a first longitudinal axis and a second row of vias aligned along a second longitudinal axis parallel to the first longitudinal axis, and wherein vias of the first row of vias and corresponding vias of the second row of vias are disposed as respective opposed pairs of vias;

a via structure disposed through the substrate and extending between the plurality of vias, wherein the via structure is filled with a magnetic material to form a magnetic core of the inductor, wherein the via structure comprises a longitudinal trench disposed between the first row of vias and the second row of vias and extending parallel to both the first row of vias and the second row of vias, and a plurality of transverse trenches disposed between opposed pairs of the plurality of vias; and one or more patterned metallization layers interconnecting the conductive metal of the plurality of vias, wherein the one or more patterned metallization layers comprise a first patterned metallization layer disposed perpendicularly between and interconnecting the conductive metal of the respective opposed pairs of vias and a second patterned metallization layer forming diagonal interconnections between the conductive metal of a plurality of vias of the first row of vias and a plurality of vias of the second row of vias, wherein the diagonal interconnections of the second patterned metallization layer overlie corresponding transverse trenches of the plurality of transverse trenches;

wherein the one or more patterned metallization layers and the conductive metal filling the plurality of vias form a winding of the inductor about the magnetic core.

2. The device of claim 1, wherein the via structure comprises: a longitudinal row of vias disposed between the plurality of vias.

3. The device of claim 1, wherein the device comprises at least one of:

a music player;
a video player;
an entertainment unit;
a navigation device;
a communications device;
a mobile device;
a mobile phone;
a smartphone;
a personal digital assistant;
a fixed location terminal;
a tablet computer, a computer;
a wearable device;
a laptop computer;
a server;
an internet of things (IoT) device; or
a device in an automotive vehicle.

4. A device including an inductor, the inductor comprising:

a substrate having a first planar surface and a second planar surface opposite the first planar surface;

a first row of vias disposed through the substrate and filled with a conductive metal, wherein the first row of vias is aligned along a first longitudinal axis;

a second row of vias disposed through the substrate and filled with the conductive metal, wherein the second row of vias is laterally displaced from the first row of vias and aligned along a second longitudinal axis parallel to the first longitudinal axis, wherein vias of the first row of vias and corresponding vias of the second row of vias are disposed as respective opposed pairs of vias;

a via structure disposed through the substrate and extending parallel to both the first row of vias and the second row of vias, the via structure being filled with a magnetic material to form a magnetic core of the inductor that is electrically insulated from the conductive metal filling the first row of vias and the conductive metal filling the second row of vias, wherein the via structure comprises a longitudinal trench disposed between the first row of vias and the second row of vias, and a plurality of transverse trenches disposed between the respective opposed pairs of vias;

a first patterned metallization layer exterior to the first planar surface disposed perpendicularly between and interconnecting the conductive metal of the respective opposed pairs of vias; and a second patterned metallization layer exterior to the second planar surface forming diagonal interconnections between the conductive metal of the first row of vias and the conductive metal of the second row of vias, wherein the diagonal interconnections are disposed to overlie corresponding transverse trenches of the plurality of transverse trenches;

wherein the first patterned metallization layer, the second patterned metallization layer, the conductive metal filling the first row of vias, and conductive metal filling the second row of vias form a winding of the inductor about the magnetic core.

5. The device of claim 4, wherein the via structure comprises: a longitudinal row of vias disposed between the first row of vias and the second row of vias.

6. The device of claim 4, wherein:

the magnetic material is not electrically conductive.

7. The device of claim 4, wherein:

the first patterned metallization layer is formed on the first planar surface of the substrate; and the second patterned metallization layer is formed on the second planar surface of the substrate.

8. The device of claim 4, the inductor further comprising:

a first patterned insulating layer overlying the first planar surface of the substrate to electrically insulate the magnetic material filling the via structure from the first patterned metallization layer, the first patterned insulating layer having openings filled with the conductive metal to connect the first row of vias and second row of vias with the first patterned metallization layer; and a second patterned insulating layer overlying the second planar surface and electrically insulating the magnetic material filling the via structure from the first patterned metallization layer, the first patterned insulating layer having openings filled with the conductive metal to connect the first row of vias and second row of vias with the first patterned metallization layer.

9. The device of claim 4, wherein the device comprises at least one of:

a music player;
a video player;
an entertainment unit;
a navigation device;
a communications device;
a mobile device;
a mobile phone;
a smartphone;
a personal digital assistant;
a fixed location terminal;
a tablet computer, a computer;
a wearable device;
a laptop computer;
a server;
an internet of things (IoT) device; or
a device in an automotive vehicle.

10. A method of fabricating an inductor, comprising:

forming a plurality of vias disposed through a substrate and filled with a conductive metal, wherein the plurality of vias comprises a first row of vias aligned along a first longitudinal axis and a second row of vias aligned along a second longitudinal axis parallel to the first longitudinal axis, and wherein vias of the first row of vias and corresponding vias of the second row of vias are disposed as respective opposed pairs of vias;

forming a via structure disposed through the substrate and filled with a magnetic material, the via structure extending between the plurality of vias and forming a magnetic core of the inductor, wherein the via structure comprises a longitudinal trench disposed between the first row of vias and the second row of vias and extends parallel to both the first row of vias and the second row of vias, and a plurality of transverse trenches disposed between opposed pairs of the plurality of vias; and forming one or more patterned metallization layers interconnecting the conductive metal of the plurality of vias, wherein the one or more patterned metallization layers comprise a first patterned metallization layer disposed perpendicularly between and interconnecting the conductive metal of the respective opposed pairs of vias, and a second patterned metallization layer forming diagonal interconnections between the conductive metal of vias of the first row of vias and the conductive metal of vias of the second row of vias, wherein the diagonal interconnections are disposed to overlie corresponding transverse trenches of the plurality of transverse trenches;

wherein the one or more patterned metallization layers and the conductive metal filling the plurality of vias form a winding of the inductor about the magnetic core.

11. The method of claim 10, wherein the via structure comprises: a longitudinal row of vias disposed between the plurality of vias.

12. A method of fabricating an inductor, comprising:

forming a first row of vias through a substrate, wherein the first row of vias is aligned along a first longitudinal axis;

forming a second row of vias through the substrate, wherein the second row of vias is laterally displaced from the first row of vias and aligned along a second longitudinal axis parallel to the first longitudinal axis, wherein vias of the first row of vias and corresponding vias of the second row of vias are disposed as respective opposed pairs of vias;

forming a via structure through the substrate extending parallel to both the first row of vias and the second row of vias, wherein the via structure comprises a longitudinal trench disposed between the first row of vias and the second row of vias, and a plurality of transverse trenches disposed between the opposed pairs of vias;

filling the first row of vias and the second row of vias with a conductive metal;

filling the via structure with a magnetic material;

forming a first patterned metallization layer exterior to a first planar surface of the substrate, wherein the first patterned metallization layer is disposed perpendicularly between and electrically interconnects the conductive metal of the respective opposed pairs of vias; and forming a second patterned metallization layer exterior to a second planar surface of the substrate opposite the first planar surface, wherein the second patterned metallization layer forms diagonal interconnections between the conductive metal of vias of the first row of vias and the conductive metal of vias of the second row of vias, and wherein the diagonal interconnections are disposed to overlie corresponding transverse trenches of the plurality of transverse trenches;

wherein the first patterned metallization layer, the second patterned metallization layer, the conductive metal filling the first row of vias, and conductive metal filling the second row of vias form a winding of the inductor about a magnetic core formed by the magnetic material in the via structure.

13. The method of claim 12, wherein:

the first row of vias and the second row of vias are formed concurrently during a processing operation.

14. The method of claim 13, wherein:

the via structure is formed during the processing operation concurrently with the first row of vias and the second row of vias.

15. The method of claim 12, wherein forming the via structure comprises:

forming a longitudinal row of vias disposed between the first row of vias and the second row of vias.

16. The method of claim 12, further comprising:

forming a first patterned insulating layer overlying the first planar surface of the substrate wherein the first patterned insulating layer is patterned to electrically insulate the magnetic material filling the via structure from the first patterned metallization layer while leaving openings over the first row of vias and the second row of vias;

filling the openings of the first patterned insulating layer with the conductive metal to connect the conductive metal filling the first row of vias with the conductive metal filling the second row of vias with the first patterned metallization layer;

forming a second patterned insulating layer overlying the second planar surface of the substrate wherein the second patterned insulating layer is patterned to electrically insulate the magnetic material filling the via structure from the second patterned metallization layer while leaving openings over the first row of vias and the second row of vias; and filling the openings of the first patterned insulating layer with the conductive metal to connect the conductive metal filling the first row of vias with the conductive metal filling the second row of vias with the first patterned metallization layer.

* * * * *